United States Patent [19]

Schoeff

[11] 4,092,726
[45] May 30, 1978

[54] ANALOG-TO-DIGITAL CONVERTER SYSTEM

[75] Inventor: John A. Schoeff, Mesa, Ariz.

[73] Assignee: Motorola, Inc., Schaumburg, Ill.

[21] Appl. No.: 570,908

[22] Filed: Apr. 23, 1975

Related U.S. Application Data

[62] Division of Ser. No. 370,519, Jun. 15, 1973, abandoned.

[51] Int. Cl.² .............................................. G06G 7/18
[52] U.S. Cl. .............................. 364/829; 340/347 NT
[58] Field of Search ................. 340/347 NT, 347 AD, 340/347 DA; 235/183; 328/187

[56] References Cited

U.S. PATENT DOCUMENTS

| | | | |
|---|---|---|---|
| 3,541,446 | 11/1970 | Prozeller | 340/347 NT |
| 3,550,113 | 12/1970 | Williams | 340/347 AD |
| 3,651,517 | 3/1972 | Kurek | 340/347 DA |
| 3,713,136 | 1/1973 | Nagy | 340/347 NT |
| 3,766,402 | 10/1973 | Raamot | 340/347 DA |

OTHER PUBLICATIONS

Schmid "Electronics" Nov. 28, 1966, pp. 88–94.

*Primary Examiner*—Charles D. Miller
*Attorney, Agent, or Firm*—Maurice J. Jones, Jr.

[57] ABSTRACT

An analog subsystem is disclosed which can be included in a single monolithic, integrated circuit chip and which is for use with a digital subsystem to form a dual ramp analog-to-digital converter. A current steering network included in the analog subsystem is connected to a reference current source and to an input voltage-to-current converter. An integrator is connected to the output of the current steering network, and a comparator is connected to the output of the integrator. The current steering network selectively conducts the current from the converter to charge the integrator for a predetermined period of time, which is terminated by the application of a signal to the current steering network by the digital subsystem. The network then conducts the current from the constant reference current source to discharge the integrator which ultimately triggers the comparator. A comparator output signal then terminates the count of a counter in the digital subsystem to provide a reading proportional to the magnitude of the analog voltage being measured. The analog subsystem further includes a ramp offset current source which increases system noise immunity and improves the linearity of the current steering network. Temperature compensating, tracking, and limiting techniques are utilized to decrease the effect of temperature on the analog subsystem and to increase speed of operation.

6 Claims, 7 Drawing Figures

ANALOG-TO-DIGITAL CONVERTER SYSTEM

This is a division, of application Ser. No. 370,519, filed June 15, 1973, now abandoned.

CROSS REFERENCE TO RELATED APPLICATIONS

The subject matter of the present application is related to the subject matter of a patent application entitled "Low Hysteresis Threshold Detector Having Controlled Output Slew Rate", Ser. No. 370,517 and of a patent application entitled "Balanced Double-To-Single Ended Converter Stage For Use With A Differential Amplifier", Ser. No. 370,518 now U.S. Pat. No. 3,894,290, which were filed on even date herewith by the present inventor and were assigned to the same assignee.

BACKGROUND OF THE INVENTION

Circuitry for converting analog signals into corresponding, equivalent digital signals has a multiplicity of uses in present day instrumentation and telemetry equipment. One prior art analog-to-digital (A-to-D) converter known as the "dual ramp" type is comprised of an analog portion and a digital or logic portion. The analog portion generally includes a controllable voltage switch, an integrator and a comparator. The input terminal of the integrator is connected through a resistor to the output terminal of the voltage switch, and the output terminal of the integrator is connected to the comparator. The logic portion generally includes a clock, a gate, a counter, a bistable multivibrator (flip-flop), a storing circuit and a processing circuit. The gate has a first input terminal connected to the output terminal of the clock and a second input terminal connected to the output terminal of the comparator. The counter is connected to the output terminal of the gate. One output terminal of the counter is connected through the flip-flop to the control terminal of the voltage switch, and other output terminals of the counter are connected through latch and multiplexer circuits to a binary-coded-decimal (BCD) display or other digital utilization and processing circuitry.

In operation, the voltage switch connects an unknown input voltage at a first of its input terminals to the integrator which stores a charge in response to the input voltage while the clock drives the counter. The input voltage causes a first ramp voltage at the output of the integrator. After a predetermined time period, a given count in the counter triggers the flip-flop which causes the voltage switch to disconnect the input voltage and connect a reference voltage, of opposite polarity as compared with the input voltage, to the input terminal of the integrator. At the instant when the voltage switch changes state, the output voltage of the integrator is at a peak which is proportional to the magnitude of the input voltage. The reference voltage causes the magnitude of the output voltage of the integrator to decrease from its peak value toward a zero or reference level at a constant slope to form a second ramp. The counter is reset simultaneously with the start of the second ramp. Since the peak of the second ramp is proportional to the magnitude of the input voltage and the slope of the second ramp is constant, the time period for the second ramp to reach zero is proportional to the magnitude of the input voltage. The comparator is triggered by the output voltage of the integrator reaching the reference level and turns off the gate which disconnects the clock from the counter. As a result a count, in the form of a binary output signal existing in the counter, is proportional to the magnitude of the input voltage. After the binary output is stored in the latch circuit, another conversion cycle begins during which the binary output may be processed and the storage cleared.

One of the several advantages of the dual ramp system is that the binary output signal is independent of changes in the integrator capacitor, the integrator resistor, and the clock rate because all three are common to the first and second ramps. Hence, the long term variations of these parameters cancel out. Moreover, long term changes in the comparator threshold voltage is balanced out by the dual ramp system. Hence, the dual ramp, A-to-D converter system, has distinct advantages as compared to some other prior art A-to-D systems for applications in which the magnitude of an unknown voltage is required to be precisely measured and provided in digital form. One such application relates to a digital volt meter (DVM) which provides a decimal output display of the magnitude of a direct current voltage applied to the input terminals thereof.

Prior art embodiments of the analog portion of the dual ramp configuration requires at least four integrated circuits and a plurality of discrete active and passive components having critical values. These configurations are not suitable for being provided in the form of one monolithic integrated circuit. For instance prior art analog portions, capable of responding to input voltages of either polarity, require two large field effect transistors (FETs) for performing voltage switching. Such low resistance FET devices take up a large amount of chip area. Moreover, these FETs have undesirably slow switching times because of high capacitances associated therewith. Furthermore, other circuitry of the analog portion is best provided in bipolar form. Since inexpensive processes for providing FET devices and bipolar devices in the same chip are not known, prior art configurations requiring both kinds of devices are not desirable for being provided in one chip.

Another problem with prior art dual ramp circuit configurations relates to providing an analog portion which can respond to input voltages of different polarities. Most prior art systems are set up for an input voltage of given polarity. Thus the reference voltage must be switched in polarity, and the logic must be reversed if the polarity of the input signal is changed. Conventional operational amplifiers and integrators suitable for providing this function require a dual power supply providing three voltage potentials which increases the cost, complexity, size and weight of the sytem.

Still another problem with some prior art configurations occurs when zero input voltage is applied to the converter. As the input voltage approaches zero, the amount of current fed to the integrator also approaches zero and the initial ramp slope approaches zero. As the ramp slope decreases, noise is more likely to trigger the circuitry and the circuit is likely to lock up in a static state thereby causing false outputs. Furthermore, some of the prior art systems require precision resistors and capacitors which are not suitable for being provided in monolithic form by an inexpensive process. Hence, the prior art discrete analog circuit configurations cannot be readily adapted to take advantage of the increased reliability, smaller size, lower weight, reduced cost, and lower power dissipation inherent in monolithic structures.

SUMMARY OF THE INVENTION

One object of the present invention is to provide an improved analog-to-digital converter circuit.

Another object of the invention is to provide a circuit configuration for the analog portion of a dual ramp analog-to-digital converter which is suitable for being manufactured as a single integrated circuit.

Still another object of the invention is to provide an analog circuit configuration for a dual ramp A-to-D converter which does not require field effect transistors and critical components so that it can be mass produced by state of the art bipolar processes.

A further object of the invention is to provide an analog circuit configuration which inherently balances out undesired thermal currents.

A still further object of the invention is to provide an analog circuit configuration which creates an offset ramp when no input voltage is applied.

An additional object of the invention is to provide an analog circuit configuration which is responsive to input voltages of either polarity and which requires only a power supply providing a bi-level potential.

A still additional object of the invention is to provide an analog circuit configuration which employs high speed steering of input currents to its output terminal.

In brief, the analog-to-digital converter system of one embodiment of the invention, which includes analog and digital subsystems, provides a digital output which is proportional to the amplitude of an input voltage. The analog subsystem of the converter includes a reference voltage supply which provides a voltage of constant amplitude for driving a reference voltage-to-current converter to provide a reference current having a constant magnitude at its output terminal. An input voltage-to-current converter provides an input current at an output terminal thereof which has a magnitude that is proportional to the magnitude of the input voltage and which flows in a direction opposite to the reference current. The analog subsystem also includes a current steering network having one input terminal connected to the output terminal of the reference current supply and another input terminal connected to the output terminal of the input voltage-to-current converter. The current steering network responds to a first control signal provided by the digital subsystem to initially steer the input current into an integrator for a predetermined time. The input current tends to cause the integrator output voltage to ramp away from an initial potential for the predetermined period of time at the end of which the digital subsystem applies a second control signal to the current steering network which then steers the reference current of constant magnitude to the integrator. The reference current then causes the integrator output voltage to ramp back toward the initial potential at a constant slope. Hence, the integrator output voltage reaches the initial level at a second time period after the second control signal which is proportional to the magnitude of the input voltage. In response to the integrator output voltage reaching the initial voltage, a comparator connected to the integrator changes output signal state and thereby causes a counter of the digital subsystem to store the digital signal until it can be shifted into another storage circuit after which a second conversion cycle begins. The analog subsystem further includes a ramp offset current converter which provides a minimum slope during the ramp away from the initial voltage to thereby increase the noise immunity and increase linearity between the digital output signal and the input voltage magnitude. The counter of the digital subsystem is designed to have additional counts to compensate for the effect of the ramp offset current on the ramp signals. Furthermore, temperature compensation and tracking techniques are utilized to make the converter response relatively independent of temperature change. Also clamping techniques are employed to limit the dynamic range of signals in the analog subsystem and thereby increase the conversion speed and the maximum conversion frequency.

DETAILED DESCRIPTION OF THE PREFERRED EMBODIMENT

Figure 1:
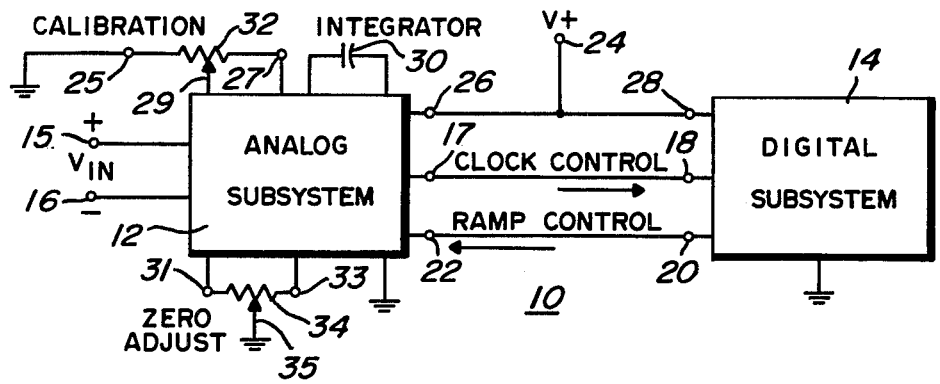
FIG. 1 is a block diagram showing the control signal flow between one integrated circuit including an analog subsystem and another integrated circuit including a digital subsystem for providing a complete dual ramp, analog-to-digital converter.

As indicated in FIG. 1, a complete dual ramp analog-to-digital (A-to-D) converter 10 is constructed by the interconnection of an analog subsystem integrated circuit chip 12 of the invention and a digital subsystem integrated circuit chip 14 which may be of the prior art. Analog subsystem 12 is responsive to the magnitude of an input voltage applied between system input terminals 15 and 16 to provide a clock control signal at pinout terminal 17 which is connected to pinout terminal 18 of digital subsystem 14. A ramp control signal is developed at pinout terminal 20 by digital subsystem 14 which is connected to pinout terminal 22 of analog subsystem 12. A power supply voltage, which may be between +5 and +18 volts, connected to terminal 24 is provided to power supply terminals 26 and 28 respectively of analog subsystem 12 and digital subsystem 14. As shown in FIG. 1, integrator capacitor 30, full scale calibration potentiometer 32 and zero adjust potentiometer 34 are the only external components required by analog subsystem 12. Potentiometer 32 is connected between terminals 25, 27 and 29. Potentiometer 34 is connected between terminals 31, 33 and 35.

Figure 2:
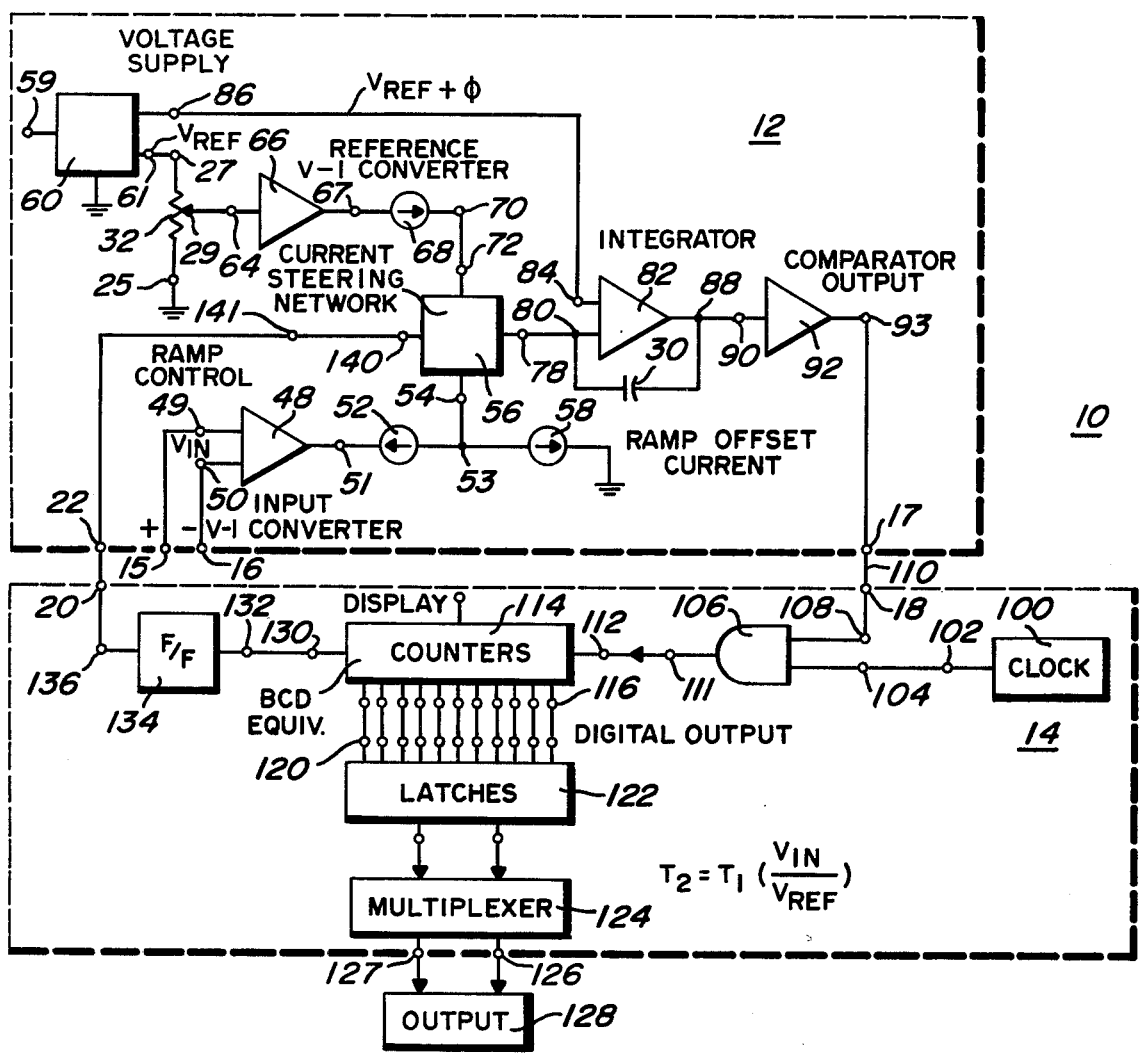
FIG. 2 is a block diagram of the analog subsystem of one embodiment of the invention interconnected with the blocks of a digital subsystem.

The cooperative operation of analog subsystem 12 and digital subsystem 14 is described in detail with respect to FIG. 2, which is a more complete block diagram of a dual ramp A-to-D converter system including analog subsystem 12 of one embodiment of the invention. Common reference numbers are employed in the figures where appropriate. Analog subsystem 12 includes an input operational amplifier 48 having input terminals 49 and 50 connected to system input terminals 15 and 16. Output terminal 53 of input voltage-to-current converter 52, which includes amplifier 48, is connected to input terminal 54 of current steering network 56 which is also connected to ramp offset current generator 58. Converter 52 draws a current from output terminal or node 53 which has an instantaneous magnitude that is proportional to the instantaneous magnitude of the input voltage.

Voltage reference supply 60 has an input terminal 59 which is adapted to receive the power supply voltage, and a first output terminal 61 connected through full scale calibration potentiometer 32 to input terminal 64 of reference voltage operational amplifier 66. Supply 60 provides a voltage at terminal 61 having a regulated amplitude of, for instance, 1.2 volts. Reference voltage-to-current converter 68 has an input terminal connected to output terminal 67 of operational amplifier 66 and an output terminal 70 connected to second input terminal 72 of current steering network 56. Reference voltage operational amplifier 66 provides a voltage for controlling converter 68 which has a regulated amplitude determined by the setting of potentiometer 32. Converter 68 creates a current having a constant magnitude which tends to flow in a direction opposite to the current of converter 52.

Output terminal 78 of current steering network 56 is connected to first input terminal 80 of integrator 82. Second input terminal 84 of integrator 82 is connected to second output terminal 86 of voltage reference supply 60. Supply 60 provides a temperature variable voltage at terminal 86 having an amplitude of, for instance, 2.1 volts. Integrating capacitor 30 is connected from input terminal 80 to output terminal 88 of integrator 82 and provides an output voltage responsive to the current of either converters 52 or 68 which is connected thereto by network 56. Since integrator 82 is current driven, its gain and input offset voltage are not critical factors.

Input terminal 90 of comparator 92 is connected to output terminal 88 of integrator 82, and comparator output terminal 93 is accessible through pinout terminal 17 of analog integrated circuit 12. Comparator 92 responds to the magnitude of the output voltage of integrator 82 going through a threshold level of for instance one volt to switch its output signal level to provide the clock control signal. Comparator 92 should have low hysteresis and relatively slow rise and fall times to reduce system noise.

Digital subsystem 14, which is provided on a separate integrated circuit chip with respect to analog subsystem 12 as indicated in FIG. 2, may be manufactured by complimentary metal oxide semiconductor (CMOS) processes. Digital subsystem 14 includes clock generator 100 which provides a square wave having a constant repetition rate as high as 10 megahertz (MHz) at output terminal 102 which is connected to one input terminal 104 of AND gate 106. The other input terminal 108 of gate 106 is connected to comparator pinout terminal 17 of analog subsystem 12 through pinout terminal 18 and an external conductor for receiving the clock control signal. Output terminal 111 of gate 106 is connected to drive terminal 112 of counter 114. A plurality of output terminals 116 of counter 114 are connected to a corresponding plurality of input terminals 120 of latch or storage circuit 122. The output terminals of latch circuit 122 are connected to the input terminals of multiplexer 124 and the output terminals of multiplexer 124 are made accessible through pinouts 126 and 127 so that external electrical connections can be made to output stage 128. Binary coded decimal (BCD) circuitry and either a numerical liquid crystal or light emitting diode display can be included in output block 128. Output terminal 130 of counter 114 is connected to input terminal 132 of bistable multivibrator (flip-flop) 134. Output terminal 136 of flip-flop 134 is accessible through pinout 20 to facilitate interconnection between chips 12 and 14 by the external conductor extending between pinout 20 of chip 14 and pinout 22 of chip 12. Ramp control input terminal 141 of network 56 is connected to pinout 22.

Figure 3:
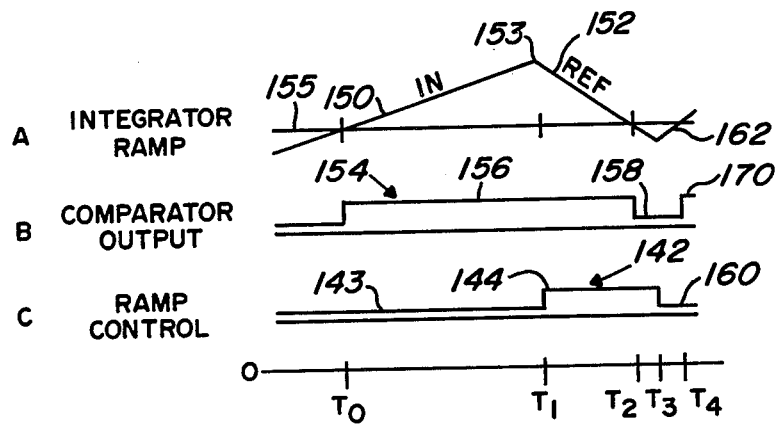
FIG. 3 is a timing diagram illustrating the operation of the analog subsystem in FIG. 2.

For purposes of explaining the operation of the converter, it is assumed that a d.c. input or analog voltage, having a magnitude to be measured and displayed is connected between system input terminals 15 and 16 and that current steering network 56 initially connects input terminal 54 thereof to output terminal 78 thereof. It is also assumed that the current steering network initially steers the output current from reference voltage-to-current converter 68 to ground. In response to the input voltage magnitude, input voltage-to-current converter 52 draws current from integrating capacitor 30 through current steering network 56 to ground. As a result capacitor 30 charges while a clock signal from clock 100 is gated by gate 106 into counter 114 which counts for a predetermined time period between times $T_0$ and $T_1$ of FIG. 3. At time $T_1$ counter 114 attains a predetermined signal state corresponding to, for instance, a maximum count and provides a control signal to flip-flop 134. In response to the control signal from counter 114, the ramp control signal 142 of FIG. 3, line C, at output terminal 136 of flip-flop 134 is changed from low level 143 to high level 144. High level 144 of ramp control signal 142 causes current steering network 56 to steer the current from input voltage-to-current converter 52 to ground and to steer the reference current from converter 68 into the integrator. Since the reference current flows in a direction opposite to the direction of the input current, the foregoing operation terminates up-ramp 150 portion of the output voltage of integrator 82 at time $T_1$ as shown in FIG. 3a, and the output voltage begins down-ramp 152. Counter 114 resets its count in response to its predetermined signal state occurring at time $T_1$.

Since the reference current charges capacitor 30 for a fixed time, integrator output voltage peak 153 is proportional to the magnitude of the input voltage. Between times $T_1$ and $T_2$, the current from converter 68 discharges integrating capacitor 30 as shown by the negative slope of down ramp 152 of FIG. 3, line A, to cause the output voltage of integrator 82 to ramp toward reference level 155. At time $T_2$, the output voltage of comparator 92 switches from a high level 156 to a low level 158 in response to the comparator reference or threshold crossing, which may be at a 1 volt level, by the integrator output voltage as indicated by waveform 154 in FIG. 3, line B. Low level portion 158 renders gate 106 nonconductive and thereby terminates the flow of clock signals into counter 114. Thus, counter 114 stores a BCD signal which has a count proportional to the maximum voltage level 153 obtained by integrator capacitor 30. Since peak level 153 is proportional to the magnitude of the input voltage and the slope of down ramp 152 is constant, the count is proportional to the magnitude of the input voltage. The digital output signal of counter 114 is stored in latch circuit 122 and applied by multiplexer 124 to output circuit 128. Either a read out or a control signal responsive to the magnitude of the input voltage is created by output circuit 128.

Ramp offset current generator 58, shown in FIG. 2, provides a constant slope up-ramp signal corresponding to portion 150 of FIG. 3, line A, at the output of integrator 82 between times $T_0$ and $T_1$. This minimum slope signal insures that the current switching system of network 56 remains operational even when either no or a very small amplitude input voltage is applied between system input terminals 15 and 16. Thus, the tendencies of the A-to-D converter to latch up in an undesired steady state condition and to undesirably respond to noise signals are reduced. To compensate for the minimum slope of up-ramp 150 and hence, the minimum slope of down-ramp 152 caused by the current drawn from the integrating capacitor by ramp offset current generator 58, it is necessary to provide additional counts in counter 114. More specifically, if the ramp offset current provides a 5 percent increase in the slope of up-ramp 150 by drawing 5 percent of the full scale current, counter 114 must have a delay or extra counts equal to 5 percent of the number of counts necessary to cause ramp control signal 142 to change from a low to a high level. Otherwise, the increased slopes would cause the A-to-D converter to always provide an inaccurate reading. The ramp offset current is connected to integrator 82 through steering network 56 only between times $T_0$ and $T_1$ of each conversion cycle.

As shown in FIG. 3, line A, down-ramp 152 continues below threshold level 155 until time $T_3$, which is after comparator output signal level 158, has shut off the gate at time $T_2$. At time $T_3$, flip-flop 134 changes the ramp control signal 142 from high level 144 to low level 160 which causes the current steering network to switch and again allows the ramp offset current and the input current from converter 52 to affect the integrator output voltage, thereby causing up ramp 162 of FIG. 3, line A, to begin at time $T_3$. At time $T_4$, the output voltage up ramp 162 of integrator 82 passes through threshold level 155 thereby switching comparator 92 which then provides high level 170 at output terminal 93, as indicated in FIG. 3, line B. High level comparator output signal 170 renders gate 106 conductive at time $T_4$ which allows the clock signal from clock 100 to again start driving counter 114 to begin a new conversion cycle similar to the one which was previously described.

Between times $T_2$ and $T_4$, the signal states of counter 114 remain static because of the delay provided by flip-flop 134 so that latch out circuitry 122 can store the binary count which indicates the measured magnitude of the input signal. Counter 114 is reset after time $T_3$ and before time $T_4$ and after the information is transferred into the latch circuit 120. The counter off or "time out" period between times $T_3$ and $T_4$ is exaggerated in FIG. 3 for purposes of illustration. This time out period has no affect upon the accuracy of measurement of input voltage magnitude. Hence, the general sequence of operation during a conversion cycle has been described. The time period between $T_0$ and $T_2$ is the active conversion period and the time period between $T_2$ and $T_4$ is the counter "time out" period.

Figure 4:
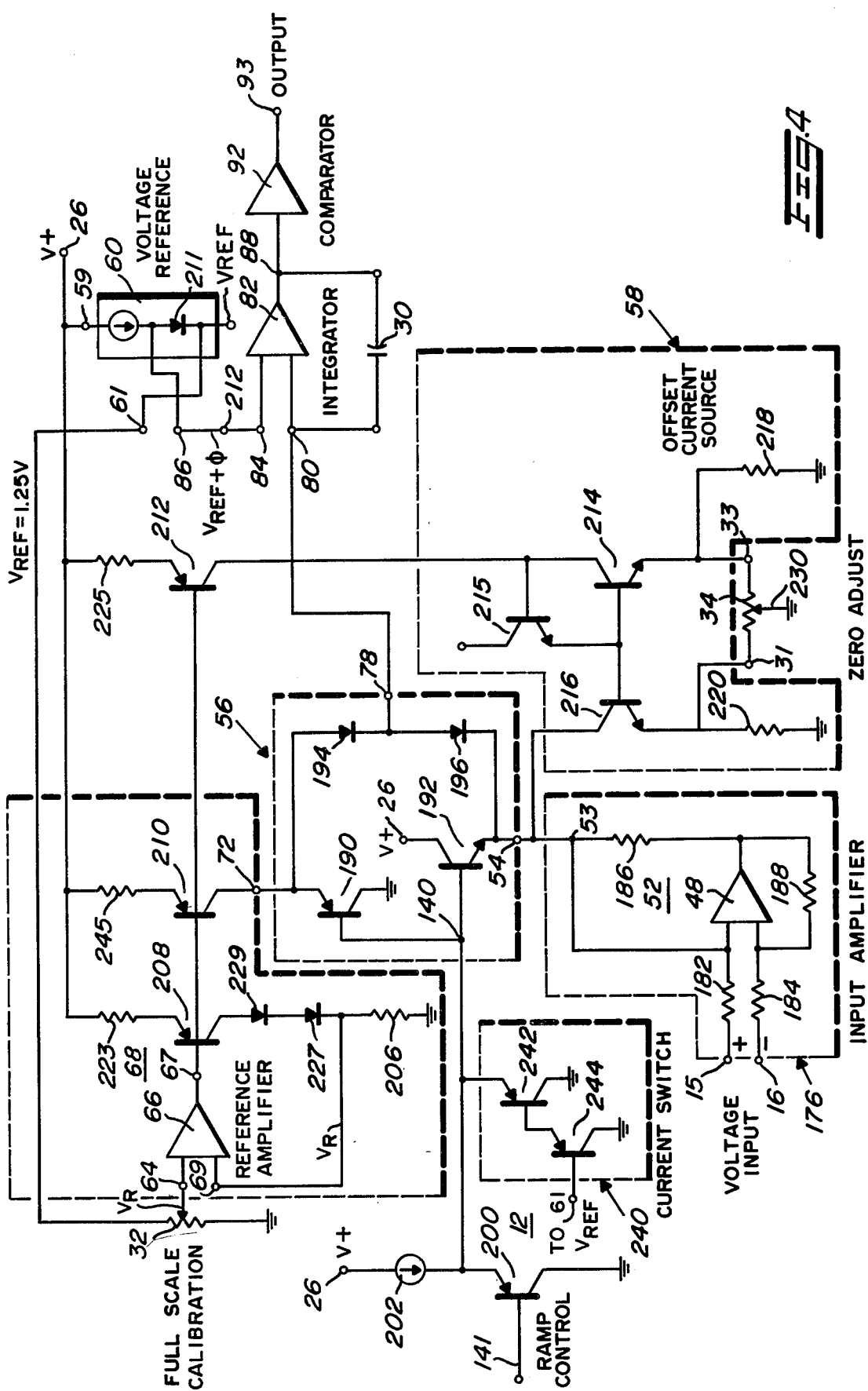
FIG. 4 is a partial block and partial schematic diagram of the analog subsystem of FIG. 2.

A more detailed schematic diagram of the analog subsystem of chip 12 is shown in FIG. 4. Reference numbers previously used in FIGS. 1 and 2 are used in FIG. 4 where appropriate. As previously mentioned, input voltage amplifier 48 and input voltage-to-current converter 52 are combined in bridge circuit 176, also including input resistors 182 and 184, and output resistors 186 and 188. Diffused silicon resistors 182 and 184 have values of, for instance, 4,000 ohms, and resistors 186 and 188 may have values of 1,000 ohms. This bridge circuit produces an output current having a magnitude proportional to the differential input voltage applied between system input terminals 15 and 16.

One advantage of bridge circuit 176 is that it facilitates differential operation from a single power supply providing only a bi-level potential. The input and output terminals of amplifier 48 can be held above ground because of the voltage drop across resistors 182 and 184. If positive system input terminal 15 is grounded, negative voltages are measured by applying them to resistor 184; and, if negative input terminal 16 is grounded, positive voltages are measured by applying them to resistor 182. An external switching circuit for providing this operation can be connected to system input terminals 15 and 16.

Current steering network 56 is comprised of transistors 190 and 192, and diodes 194 and 196. Ramp control transistor 200 which controls network 56 includes a base electrode connected to ramp control terminal 141, a collector electrode connected to ground and an emitter electrode connected through current source 202 to the positive supply terminal 26, and through terminal 140 to the bases of current steering transistors 190 and 192. The collector of transistor 192 is connected to positive supply terminal 26 and the collector of transistor 190 is connected to ground. The anode of diode 194 is connected to the emitter of transistor 190 and to network input terminal 72. The cathode of diode 194 is connected to the anode of diode 196 and network output terminal 78. The cathode of diode 196 is connected to the emitter of transistor 192 and to network input terminal 54. Thus, current steering network 56 also has a bridge configuration. Network 56 provides high speed switching or steering of currents from converters 52 and 68 without requiring field effect transistors. Network 56 provides smooth rapid switching of the converter currents from integrator terminal 80 to a supply terminal. Therefore, virtually no discontinuity, saturation or delay problems are provided by the bridge network.

Reference operational amplifier 66 has a high input impedance so that potentiometer 32 may be used for system calibration. Moreover, the output voltage level of amplifier 66 is set by diffused silicon resistor 206 which has a resistance that tracks the resistances of input bridge resistors 182 and 184 with temperature. PNP transistors 208, 210 and 212 form current sources which are controlled by the magnitude of the output voltage of reference amplifier 66. More particularly, current source transistors 208 and 210 form the reference voltage-to-current converter which provides the reference current of constant magnitude between times $T_1$ and $T_2$ of FIG. 3 which is switched into integrator 82 by current switching network 56. Current source transistor 212 provides a bias current for ramp offset current source 58 which includes transistors 214, 215 and 216, resistors 218 and 220 and zero adjust potentiometer 34.

In operation, adjustment of the setting of potentiometer 32 provides a selected portion $V_R$ to terminal 64 of amplifier 66 of the regulated voltage ($V_{REF}$) from terminal 61 of supply 60. Because of the high gain of amplifier 66, the other input terminal 69 is also held within one millivolt of the selected reference voltage, $V_R$. As a result, the terminal of resistor 206 receiving current from the collector of transistor 208 is held to voltage $V_R$. Resistor 206 conducts a current equal to $V_R$ divided by its resistance to establish a collector current, a base-to-emitter voltage for transistor 208, and a fixed voltage across emitter resistor 223. The base-to-emitter voltage of current source transistor 208 and the voltage across resistor 223 controls the base-to-emitter voltage of transistor 210 which therefore supplies a current having a magnitude also equal to the reference voltage, $V_R$, divided by the resistance of resistor 206.

The geometry of transistor 212 and the value of resistor 223 can be scaled such that transistor 212 provides a current having a magnitude of one half the magnitude of the reference current conducted by transistor 210. The collector current of transistor 212 provides bias for offset current source bias transistor 214 which develops the bias voltage for transistor 216. The geometry of transistor 216 can be scaled with respect to the geometries of transistors 214 and 212 so that transistor 216 draws a current which is proportional to the current drawn by transistor 208. More particularly, transistor 214 may be designed to conduct five times as much current as transistor 210 so that transistor 216 draws a current having a magnitude of 1/10 the reference current magnitude. Thus, the current drawn by current source transistors 208, 210, 212 and 216 are ultimately controlled by the setting of reference potentiometer 32. Consequently, the offset current is a fixed known percentage of the reference current. Counter 114 is designed to have the appropriate amount of delay or extra counts of 5 percent of its total count from $T_0$ to $T_1$ to compensate for the offset current.

Emitter resistors 223, 245 and 225 connected between the emitters of transistors 208, 210 and 212 and the positive supply 26 provide negative feedback which improves thermal characteristics and also increases the output impedances of the current source transistors. The parameters of transistors 208, 210 and 212 are arranged to track each other with temperature change because they are located near each other on the die. Also, diodes 227 and 229 are connected in the collector circuit of transistors 208 to equal the number of diode drops in the collector circuits of transistors 210 and 212 to further facilitate temperature tracking, to compensate for base width modulation and to keep the ratios of the currents through transistors 210 and 212 constant.

The dynamic operation of the circuit of FIG. 4 beginning at time $T_0$ is now considered. As shown in FIG. 3, line C, the ramp control voltage 142 is at a low level 143 at $T_0$ which allows the positive voltage at the emitter of ramp control PNP transistor 200 to turn transistor 200 on. Hence, the resistance of transistor 200 becomes low and it applies a near ground but slightly positive potential to the interconnected bases of transistors 190 and 192. As a result, transistor 190 is rendered conductive and transistor 192 is rendered nonconductive at time $T_0$. The bias voltage at input terminal 80 of integrator 82 is about equal to the temperature dependent bias voltage at input terminal 84, which is controlled by reference supply 60 to be less positive than the supply voltage at terminal 26. Because of the decreased voltage drop across transistor 190 and the voltage at terminal 80, diode 194 is rendered nonconductive, and diode 196 is rendered conductive. Therefore, between times $T_0$ and $T_1$ of FIG. 3, the current from reference current source transistor 210 is conducted through transistors 190 and 200 to ground and currents are drawn from integrating capacitor 30 by current sources 52 and 58.

More particularly, between times $T_0$ and $T_1$, diode 196 is rendered conductive by nonconductive transistor 192. Since input 84 of integrator 82 is connected to output 86 of reference supply 60, a voltage equal to a reference voltage of, for instance, 1.2 volts plus one diode drop is developed at input terminal 80 by integrator 82. Between times $T_0$ and $T_1$, the voltage renders diode 196 conductive so that a current is drawn from integrating capacitor 30. This current plus the current drawn by ramp offset current transistor 216 produces up-ramp 150 of FIG. 3, line A, which rises to a peak 153 that is a function of the differential voltage applies between system input terminals 15 and 16. Since potentiometer 34 is connected across emitter resistor 220, adjustments of arm 230 vary the amount of offset current so that balance of the analog circuit is effectuated.

Figure 5:
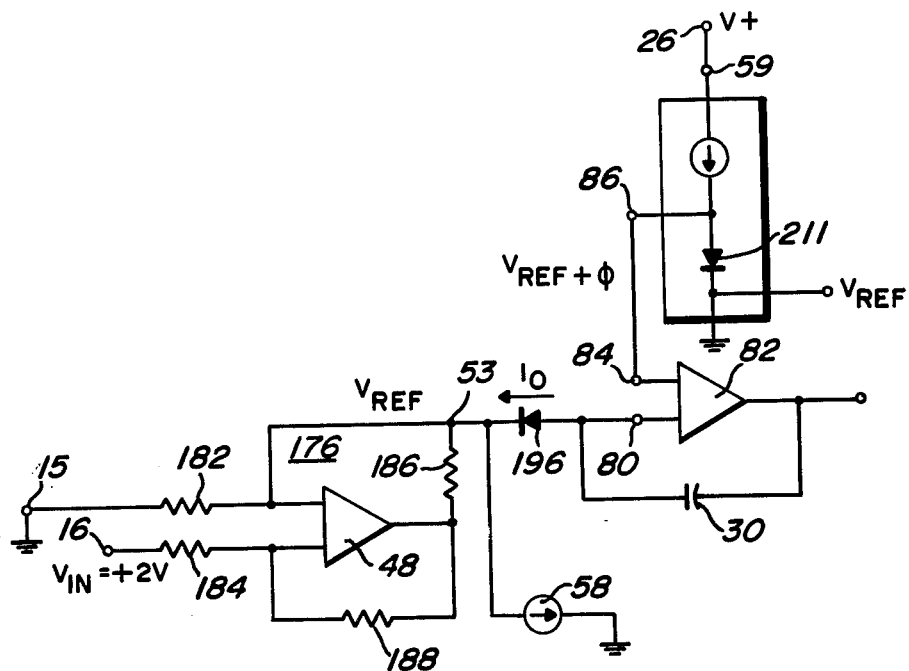
FIG. 5 is a partial block and partial schematic diagram illustrating some of the temperature compensating and linearity functions of portions of the circuit shown in FIG. 4.

An equivalent circuit of the operative portion of the circuit of FIG. 4 between times $T_0$ and $T_1$ is illustrated in FIG. 5. If the ratio of resistances of resistors 186 to 182 is equal to the ratio of the resistances of resistors 188 to 184, the output current of bridge 176 through terminal 53 is independent of the voltage at terminal 53. In monolithic circuits, however, these resistor ratios cannot be easily trimmed and the resistor mismatch may be as high as 0.5 percent. If the output voltage were allowed to vary appreciably, system accuracy would suffer due to the resulting change in the magnitude of the bridge output current. However, precautions are taken within the subject embodiment to hold the output voltage magnitude constant to compensate for resistor mismatch.

The voltage drop across bridge diode 196 changes with temperature thereby tending to cause the voltage at terminal 53 of input voltage-to-current converter amplifier 82 to undesirably change with temperature. The voltage across diode 211, which is applied through the operational amplifier 82 from input terminal 84 to input terminal 80 changes in the opposite direction with temperature as compared to the changing voltage developed at input terminal 53 by diode 196. Thus, the voltage at terminal 53 of bridge circuit 176 tends to remain constant with temperature thereby enabling the current drawn from input terminal 80 to change only with changes in the differential input voltage across terminals 15 and 16; even though, the ratio of resistors 186 to 182 is different than the ratio of resistors 188 to 184.

Figure 6:
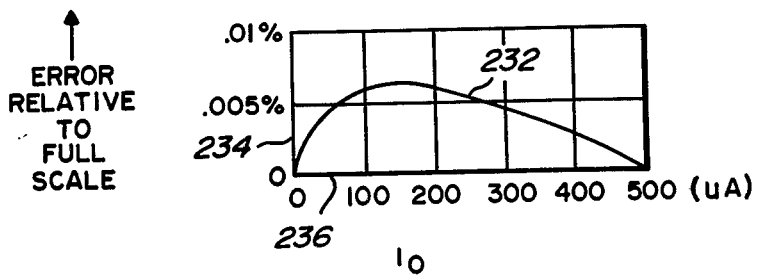
FIG. 6 is a graph illustrating input to output linearity.

The input offset current source 58 demands that a minimum current always is provided through diode 196 so there is always a minimum voltage drop thereacross. Therefore, the excursion of the current through and the voltage across diode 196 is limited. As a result, diode 196 operates on a nearly linear portion of its transfer characteristic. The linearity characteristic of converter 176 is indicated by the graph 232 in FIG. 6 which shows the output error relative to a full-scale output reading along axis 234 as a function of current ($I_0$) conducted into terminal 53 which is indicated along axis 236. As shown in FIG. 6 for a worst case resistor mismatch of 0.5 percent, the converter nonlinearity error is limited to less than 0.0075 percent. The resistor mismatch is typically on the order of 0.2 percent.

As previously described at time $T_1$, the ramp control voltage 142 of FIG. 3, line C, goes to high value 144. This causes transistor 200 to be rendered nonconductive which turns transistor 192 on and transistor 190 off because of the positive voltage developed at the emitter of transistor 200. Diode 194 is rendered conductive and diode 196 is rendered nonconductive. Thus, the current from input reference source transistor 210 is steered through diode 194 into integrating capacitor 30 to form the rampdown 152 of the integrator output waveform shown in FIG. 3, line A. Input voltage-to-current converter 52 and ramp offset current source 58 draw current through transistor 192. Thus, when the voltage at ramp control terminal 142 is pulled high, the input current is steered away from the integrator so that the change in the output voltage of the resistor bridge and subsequent settling does not affect the system performance. Thus, input amplifier 48 has time to settle before the ramp triggers the comparator off and back to begin another conversion cycle.

Diode clamp circuit 240 includes Darlington connected PNP transistors 242 and 244 which are connected between terminal 140 and terminal 61 of supply 60. Clamp circuit 240 tends to increase the switching speed by limiting the magnitude of the voltage developed at the base of transistor 192 when it is rendered conductive at time $T_1$ so that transistor 192 can more rapidly change from its on state to its off state in response to the fall of ramp control voltage 142 at time $T_3$.

As has been pointed out, there are two main transitions which occur in analog system 12. One is at peak 153 of ramp 150 at time $T_1$ when the reference current shifts from the left side of the bridge network 56 to the right side, and the other is at time $T_3$ when the reference current shifts from the right side to the left side of network 56. Terminal 72 will be at different voltage levels before and after these shifts in reference current flow. However, since the current steering bridge 56 is driven by the collector of transistor 210, it is not necessary to adjust the bias conditions on the reference amplifier before and after the change in ramp slope as is the case with some prior art circuits. The change in collector voltage on transistor 210 does not cause an appreciable change in the output current of the transistor 210 because of the circuit configuration of the invention.

At time $T_3$, ramp control voltage 142 changes from high level 144 to low level 160 to thereby render transistors 200, 190, and diode 196 conductive, and diode 194 and transistor 192 nonconductive. As a result, input current is drawn from capacitor 30 of integrator 82 through current steering network 56 and bridge 176 to form up-ramp portion 162 of FIG. 3, line A, at terminal 80. The comparator output voltage of FIG. 3, line B, does not change from low level 158 to high level 170 until ramp portion 162 crosses the voltage threshold at time $T_4$. As a result, counter 114 does not begin to count until time $T_4$ and bridge input amplifier 176 has time to settle after it is connected to input 80 of integrator 82 at time $T_3$ before the clock signal from clock 100 is gated into counter 114. Therefore, the performance of analog system 12 is not disrupted by ringing within bridge circuit 176 occurring as a result of its change in load impedance, input voltage, or other transient spurious signals caused by the switching action of current steering network 56 at the beginning of the conversion cycle. Furthermore, transient ringing in bridge circuit 176 occurring immediately after time $T_1$ does not affect the circuit performance because bridge circuit 56 disconnects bridge circuit 176 from integrator input terminal 80 at time $T_1$.

Figure 7:
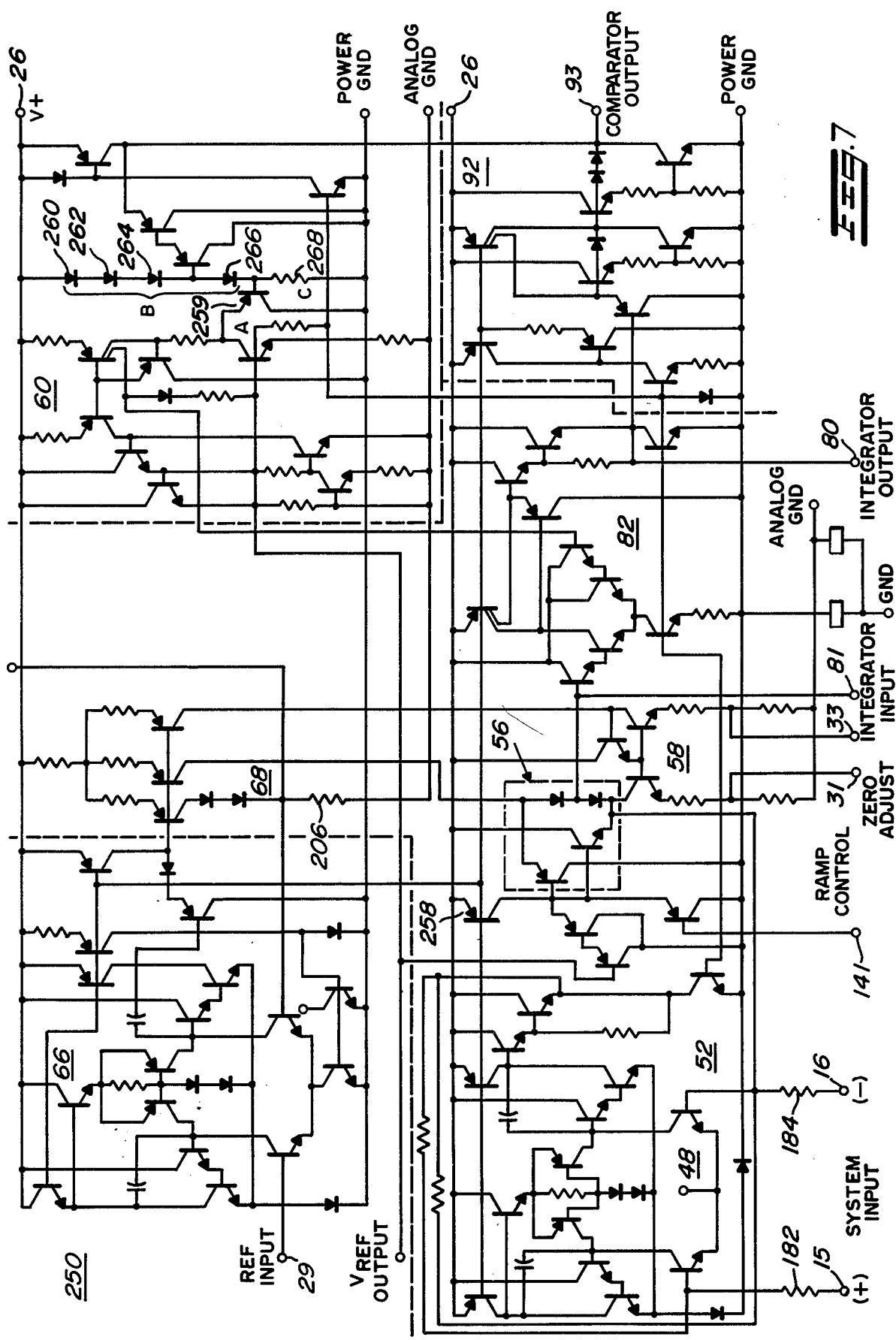
FIG. 7 is a complete schematic diagram of the analog subsystem suitable for being provided in the form of one integrated circuit by known bipolar technology.

FIG. 7 is a schematic diagram for the complete analog subsystem of one embodiment of the invention which is suitable for being manufactured in the form of a single integrated circuit. The circuit is provided in a chip having surface area dimensions of 82 mils by 88 mils. As shown in FIG. 7, operational amplifiers 48 and 66 have basically the same circuit configuration. These amplifiers each include a feedback path to provide a balanced-to-unbalanced conversion assuring good direct current balance, low thermal drift of input offset voltage and high power supply rejection. Integrator 82, shown in FIG. 7, is a single stage wide bandwidth amplifier. The low propagation delay and low output impedance of integrator 82 minimize ramp spikes and prevent input voltage change due to output current reversals during ramp turnaround. The input bias current of integrator 82 is on the order of 10 nanoamps which contributes negligible error. The comparator 92, shown in FIG. 7, is designed for low hysteresis by maintaining a constant power dissipation regardless of output state. No system errors are introduced by temperature variation of the comparator threshold, which has a value of 1 volt at 25 degrees centigrade. Nonsaturating operation of the output stage of comparator 92 is achieved without the use of gold doping or Schottky clamps. Comparator voltage gain is approximately 40,000 when driving transistor to transistor logic (TTL) and 2,000,000 when driving MOS logic. Transistor 258 of FIG. 7 provides current source 202 of the configuration shown in FIG. 4. Voltage reference circuit 60 has excellent temperature stability, low output impedance, and high power supply variation rejection. A start circuit included in voltage reference circuit 60 comprised of transistor 259, diodes 260, 262, 264 and 266 and resistor 268 is necessary for reliable operation.

Analog subsystem circuit 250 of FIG. 7 has been found to have an accuracy rating of less than plus or minus 0.01 percent error over a ambient temperature range of between 15 to 35 degrees centigrade. Its power dissipation is 50 milliwatts at a power supply voltage of 5 volts and has a power supply sensitivity of less than plus or minus 0.02 percent per volt. The differential input impedance of circuit 250 is on the order of 4,000 ohms and can be increased by driving system input terminals 15 and 16 with an input operational amplifier. Since the ramp control input threshold is on the order of 1.4 volts and the input current is on the order of 25 microamps the analog subsystem 250 is compatible with TTL and MOS logic subsystems.

What has been described is an improved A-to-D converter system having an analog portion which is suitable for being manufactured as a single integrated circuit. The analog subsystem does not require field effect transistors and can be manufactured by state of the art bipolar processes on a mass production scale. The analog circuit configuration balances out undesired thermal currents. Moreover, an offset ramp generator is provided in the analog signal portion which increases noise immunity, prevents lockup of the circuit in a static state and increases linearity. Diode clamping circuits are employed to increase switching speed. Furthermore, the analog subsystem can be easily adapted to respond to input voltages of either polarity and requires a power supply providing only a supply potential and a ground potential. The analog subsystem of the invention provides many new data monitoring possibilities and is especially useful in digital panel meters, digital multimeters and remote data acquisition systems.

I claim:

1. An analog subsystem of an electronic system which converts the magnitude of an analog voltage into a corresponding digital signal, the electronic system having a digital subsystem for providing a control signal and requiring a timing signal after the control signal, the duration between the control signal and the timing signal being required to be proportional to the magnitude of the analog voltage, the analog subsystem for providing the timing signal including in combination:

integrator means;

comparator means for providing the timing signal, said comparator means being adapted to be coupled between said integrator means and the digital subsystem;

active reference current supply means for providing a reference current at an output terminal which has a constant magnitude and a predetermined direction;

active analog voltage-to-current converter means for providing an analog current at an output terminal thereof which has a magnitude that is proportional to the magnitude of the analog voltage, said analog current having a direction opposite to said predetermined direction of said reference current;

current steering network means having a first input terminal coupled to said output terminal of said reference current supply means, a second input terminal coupled to said output terminal of said analog voltage-to-current converter means, a control terminal adapted to be coupled to the digital subsystem for receiving the control signal, and an output terminal coupled to said integrator means, said current steering network including four bipolar semiconductor devices connected in a bridge configuration between said terminals of said current steering network and being responsive to the control signal to bypass said reference current while said analog current is coupled to said integrator means and to bypass said analog current while said reference current is applied to said integrator means so that the duration between the control signal and the timing signal is proportional to the magnitude of the analog voltage;

reference voltage supply means for providing a constant voltage of a predetermined magnitude at an output terminal thereof; and ramp offset current means coupled between said output terminal of said reference voltage supply means and said second input terminal of said current steering network, said ramp offset current means being responsive to said constant voltage at said output terminal of said reference voltage supply means to provide a constant current at said second terminal of said current steering network which has a magnitude of a predetermined relationship to said magnitude of said reference current for causing the output voltage of said integrator means to change in a predetermined manner even though no analog voltage is applied to said analog voltage-to-converter means, said ramp offset current means further having bias current supply means coupled to said reference voltage supply, current control circuit means having two interconnected transistor means, one of said transistor means being coupled to said second input terminal of said current steering network means and the other of said transistor means being coupled to said bias current supply means, and potentiometer means for adjusting the magnitude of said ramp offset current applied to said second input terminal of said current steering network, said potentiometer means being connected between said two interconnected transistor means.

2. The combination of claim 1 with said current steering network means further having:

four bipolar semiconductor devices connected in a bridge configuration between said terminals of said current steering network;

a first of the bipolar semiconductor devices including bipolar transistor means of a first conductivity type connected between said first terminal and said control terminal for selectively bypassing said reference current;

a second of the devices including bipolar transistor means of a second conductivity type connected between said control terminal and said second input terminal for selectively bypassing said analog current;

a third of the devices including diode means connected between said second input terminal and said output terminal of said current steering network, said diode means being oriented to selectively conduct said analog current; and a fourth of the devices including another diode means connected between said first input terminal and said output terminal of said current steering network, said other diode means being oriented to selectively conduct said reference current.

3. The combination of claim 1 further including a clamp circuit means coupled to said control terminal of said current steering network.

4. The analog subsystem of claim 1 wherein the digital subsystem includes timing means for taking into account the effect of said ramp offset current on the duration between the control signal and the timing signal so that said duration remain proportional to the magnitudes of the analog signal.

5. The analog subsystem of claim 1 wherein said active reference current supply means and said ramp offset current means are coupled together so that the magnitude of said ramp offset current has a predetermined ratio to the magnitude of said reference current.

6. An analog subsystem for an analog-to-digital system which converts the magnitude of an analog voltage into a corresponding digital signal, the analog-to-digital system having a digital subsystem, the analog subsystem including in combination:

integrator means;

comparator means adapted to be coupled between said integrator means and the digital subsystem;

active reference current supply means for providing a reference current at an output terminal which has a constant magnitude and a predetermined direction;

active analog voltage-to-current converter means for providing an analog current at an output terminal thereof which has a magnitude that is proportional to the magnitude of said analog voltage, said analog current having a direction opposite to said predetermined direction of said reference current;

current steering network means having a first input terminal connected to said output terminal of said active reference current supply means, a second input terminal coupled to said output terminal of said active analog voltage-to-current converter means, a control terminal coupled to the digital subsystem, and an output terminal coupled to said integrator means; and ramp offset current means having reference voltage supply means for providing a constant voltage of a predetermined magnitude at an output terminal thereof, bias supply means including a transistor of one conductivity type having a base electrode coupled to said reference voltage supply means, and current control circuit means having two transistors of another conductivity type with interconnected base electrodes, one of said interconnected transistors having a first electrode coupled to said second terminal of said current steering network means and the other of said interconnected transistors having a first electrode coupled to said bias supply means, a further transistor connected between said base electrodes and said first electrode of said other of said interconnected transistors, and resistive means for adjusting the magnitude of the ramp offset current drawn from said second input terminal of said current steering network, said resistive means being connected between second electrodes of said interconnected transistors.

* * * * *